US007093003B2

(12) United States Patent
Yuh et al.

(10) Patent No.: US 7,093,003 B2
(45) Date of Patent: Aug. 15, 2006

(54) SYSTEM AND METHOD FOR UPGRADING THE REMOTE CONTROL FUNCTIONALITY OF A DEVICE

(75) Inventors: Han-Sheng Yuh, Walnut, CA (US); Weidong William Wang, Tustin, CA (US); Patrick H. Hayes, Mission Viejo, CA (US); James N. Conway, Jr., Laguna Beach, CA (US)

(73) Assignee: Universal Electronics Inc., Cypress, CA (US)

( * ) Notice: Subject to any disclaimer, the term of this patent is extended or adjusted under 35 U.S.C. 154(b) by 789 days.

(21) Appl. No.: 10/151,501

(22) Filed: May 20, 2002

(65) Prior Publication Data
US 2006/0031400 A1 Feb. 9, 2006

Related U.S. Application Data

(63) Continuation-in-part of application No. 09/905,423, filed on Jul. 13, 2001.

(60) Provisional application No. 60/344,020, filed on Dec. 20, 2001, provisional application No. 60/264,767, filed on Jan. 29, 2001.

(51) Int. Cl.
G06F 15/16 (2006.01)
(52) U.S. Cl. ............. 709/219; 709/221; 717/171
(58) Field of Classification Search ............. 709/200, 709/201, 202, 203, 217, 219, 208, 218, 220, 709/221, 248; 715/501.1, 513; 717/168, 717/171, 172, 173; 340/3.3
See application file for complete search history.

(56) References Cited

U.S. PATENT DOCUMENTS

| | | | |
|---|---|---|---|
| 4,623,887 A | 11/1986 | Welles, II | |
| 4,703,359 A | 10/1987 | Rumbolt et al. | |
| 4,774,511 A | 9/1988 | Rumbolt et al. | |
| 4,959,810 A | 9/1990 | Darbee et al. | |
| 5,251,324 A | 10/1993 | McMullan, Jr. | |
| 5,410,326 A | 4/1995 | Goldstein | |
| 5,481,256 A | 1/1996 | Darbee et al. | |
| 5,614,906 A | 3/1997 | Hayes et al. | |
| 5,710,605 A | 1/1998 | Nelson | |

(Continued)

FOREIGN PATENT DOCUMENTS

EP 1198069 A1 4/2002

(Continued)

OTHER PUBLICATIONS

Sine of the Times, www.newyork.unna.org/unna/applications/ShowMate2/readme.txt>Read Me file for 'ShowMate 2 for Newton 2.x', 1997.

(Continued)

Primary Examiner—Marc D. Thompson
(74) Attorney, Agent, or Firm—Gary R. Jarosik

(57) ABSTRACT

A system and method for upgrading remote control application resident on a device. To this end, a markup language file is created. The markup language file has a representation of information used to setup the remote control application to communicate with an appliance. The markup language file may be executed, on the device or an intermediate client with which the device is synchronized, to upload the representation of the information to a remote server. At the remote server, the uploaded information is used to automatically display user-selectable, downloadable data files relevant to the control of the appliance. Downloaded data files, which may include command codes and/or graphical user interface elements, may be used within the device to upgrade the ability of the remote control application to communicate with the appliance. The information uploaded to the server may also be used to generate demographic data regarding consumer preferences.

20 Claims, 10 Drawing Sheets

U.S. PATENT DOCUMENTS

| | | |
|---|---|---|
| 5,872,562 A | 2/1999 | McConnell et al. |
| 5,959,751 A | 9/1999 | Darbee et al. |
| 5,988,078 A | 11/1999 | Levine |
| 6,014,092 A | 1/2000 | Darbee et al. |
| 6,020,881 A | 2/2000 | Naughton et al. |
| 6,052,750 A | 4/2000 | Lea |
| 6,097,441 A | 8/2000 | Allport |
| 6,104,334 A * | 8/2000 | Allport ..................... 341/175 |
| 6,127,941 A | 10/2000 | Van Ryzin |
| 6,130,726 A | 10/2000 | Darbee et al. |
| 6,175,860 B1 | 1/2001 | Gaucher |
| 6,182,094 B1 * | 1/2001 | Humpleman et al. ....... 709/218 |
| 6,195,589 B1 | 2/2001 | Ketcham |
| 6,211,870 B1 | 4/2001 | Foster |
| 6,225,938 B1 | 5/2001 | Hayes et al. |
| 6,255,961 B1 | 7/2001 | Van Ryzin et al. |
| 6,278,499 B1 | 8/2001 | Darbee et al. |
| 6,401,059 B1 | 6/2002 | Shen et al. |
| 6,408,435 B1 | 6/2002 | Sato |
| 6,437,836 B1 | 8/2002 | Huang et al. |
| 6,476,825 B1 | 11/2002 | Croy et al. |
| 6,546,419 B1 * | 4/2003 | Humpleman et al. ....... 709/220 |
| 6,577,350 B1 | 6/2003 | Proehl et al. |
| 6,784,805 B1 | 8/2004 | Harris et al. |
| 6,804,357 B1 | 10/2004 | Ikonen et al. |
| 2001/0033243 A1 | 10/2001 | Harris et al. |
| 2001/0033244 A1 | 10/2001 | Harris et al. |
| 2002/0008789 A1 | 1/2002 | Harris et al. |
| 2002/0056084 A1 | 5/2002 | Harris et al. |
| 2003/0011640 A1 * | 1/2003 | Green et al. ................. 345/810 |

FOREIGN PATENT DOCUMENTS

| | | |
|---|---|---|
| EP | 1204275 A2 | 5/2002 |
| WO | WO 00/17738 | 3/2000 |
| WO | WO 00/17789 | 3/2000 |
| WO | WO 00/21286 | 4/2000 |
| WO | WO 01/20572 A1 | 3/2001 |
| WO | WO 01/39150 A2 | 5/2001 |
| WO | WO 01/69567 A2 | 9/2001 |

OTHER PUBLICATIONS

Harmony Remote Overview, 4 pgs., www.harmonyremote.com.
Philips, ProntoProEdit 3.0, User Manual, pp. 1-76.

* cited by examiner

FIGURE 4

```html
<!DOCTYPE HTML PUBLIC "-//W3C//DTD HTML 4.0 Transitional//EN">
<html>
<head>
<title>Go to MyNevo.com Download Center</title>
<meta http-equiv="Content-Type" content="text/html; charset=iso-8859-1">
</head>
<body bgcolor="#003366">
<form action="http://www.mynevo.com/cgi-bin/mynevo/init.cgi" method="post">
<input type="hidden" name="product" value="Nevo">
<input type="hidden" name="serial" value="4G1CDW3310B3">
<input type="hidden" name="swver" value="CPB1">
<input type="hidden" name="libver" value="CPL1">
<input type="hidden" name="ids" value="0033(Panasonic)-40a2()-3476(Hughes Network Systems)-709e(Sony)">
<input type="hidden" name="lname" value="Hayes">
<input type="hidden" name="fname" value="Patrick">
<input type="hidden" name="ident" value="Pocket_PC">
<INPUT type=hidden value="Compaq PDA" name=platform> <BR><BR><BR>
<DIV align=left>
<TABLE borderColor=#999999 cellSpacing=0 cellPadding=7 width=400 bgColor=#999999
border=0>
  <TBODY>
  <TR>
    <TD vAlign=top align=left>
      <TABLE cellSpacing=0 cellPadding=5 width="100%" bgColor=#ffffff
        border=0><TBODY>
        <TR>
          <TD vAlign=top align=middle>
            <p align="center"><FONT
          face="Verdana, Arial, Helvetica, sans-serif" size=2><B>Go to MyNevo.com
              Download Center</B></FONT></p>
            <p align="center"><b><font face="Verdana, Arial, Helvetica, sans-serif" size="2">The
              Download Center will help registered members keep Nevo™
              updated with the latest enhancements, including:</font></b></p>
            <blockquote>
              <p align="center"><font face="Verdana, Arial, Helvetica, sans-serif" size="2"><b>
              New Devices <br>
              Advanced Key Functions <br>
              Network Logos <br>
              Custom Graphics </b></font>
            </blockquote>
            <p align="center"><b><font face="Verdana, Arial, Helvetica, sans-serif" size="2">MyNevo.com
              requires current configuration information** from registered
              members in order to download enhanced features such as advanced
              key functions for current devices. This information is
              uploaded when you click the "OK" button below. </font></b></p>
            <p align="center"><b><font face="Verdana, Arial, Helvetica, sans-serif" size="2">Before
              continuing, please read the Terms and Conditions of use. If
              you agree with the Terms and conditions, click the "OK"
              button to upload your configuration information** and go to
              the MyNevo.com Download Center.</font></b>
            <p align="center"><b><font face="Verdana, Arial, Helvetica, sans-serif" size="2">
              <a href="http://www.mynevo.com/terms_frames.htm" target="_blank">Terms
              and Conditions</a></font></b></p>
            <p align="center"><font face="Verdana, Arial, Helvetica, sans-serif" size="1"><i>**
              Your configuration file contains the following information:
              Device brands and codes, Machine type and Serial number, and Owner
              name.</i></font></p>
            <p align="left"><b><font face="Verdana, Arial, Helvetica, sans-serif" size="2"></font></b></p>
          </TD>
      </TR>
    <TR>
      <TD vAlign=center align=middle bgColor=#6699ff>
        <div align="center">
          <INPUT type=submit value=OK name=submit>
        </div>
      </TD></TR></TBODY></TABLE></TD></TR></TBODY></TABLE></DIV></FORM></BODY></HTML>
```

FIGURE 7

SYSTEM AND METHOD FOR UPGRADING THE REMOTE CONTROL FUNCTIONALITY OF A DEVICE

This application claims the benefit of U.S. Provisional Patent Application No. 60/344,020, filed on Dec. 20, 2001, which is incorporated herein by reference in its entirety.

This application is a continuation-in-part of U.S. application Ser. No. 09/905,423, filed Jul. 13, 2001, which, in turn, claims priority to U.S. Provisional Application Ser. No. 60/264,767, filed on Jan. 29, 2001, both of which are incorporated herein by reference in their entirety.

BACKGROUND OF THE INVENTION

This invention relates generally to devices having remote control functionality and, more particularly, relates to a system and method for upgrading the remote control functionality of a device.

Devices having functionality for remotely controlling the operation of multiple, diverse appliances are well known. To allow such a device to be used to remotely control appliances that were not considered during the time the device was manufactured, it is also known to make the device upgradeable. For example, as described in U.S. Pat. No. 4,959,810, command codes for use in controlling the operation of controllable appliances can be downloaded into the memory of a device having remote control functionality. As described in U.S. Pat. No. 6,104,334 and PCT published application WO 00/17738, the graphical consumer interface ("GUI") of the device can additionally be upgraded to provided a means by which downloaded command codes can be transmitted to the remotely controllable appliances.

It is also known to provide customized upgrading of Internet-enabled devices based on a consumer-profile. For example, PCT published application WO 00/17789 describes a server system that maintains a profile of a particular end-consumer of network-enabled equipment and a database of new technical features for this equipment. In the case where there is a match between the consumer-profile and a new technical feature, and the consumer indicates a desire to receive notification regarding updates or sales offers, the consumer is notified via the network of the option to obtain the feature.

SUMMARY OF THE INVENTION

The subject invention is directed to an improved system and method for upgrading the remote control functionality of a device. Generally, a markup language file is created including a representation of information used to setup the remote control application to communicate with an appliance. The markup language file may be executed, on the device or an intermediate client with which the device is synchronized, to upload the representation of the information to a remote server. At the remote server, the uploaded information is used to automatically display user-selectable, downloadable data files relevant to the identified appliance. Downloaded data files, which may include command codes and/or graphical user interface elements, may be used within the device to upgrade the ability of the remote control application to communicate with the appliance. The information uploaded to the server may also be used to generate demographic data regarding consumer preferences.

A better understanding of the objects, advantages, features, properties and relationships of the invention will be obtained from the following detailed description and accompanying drawings which set forth an illustrative embodiment that is indicative of the various ways in which the principles of the invention may be employed.

BRIEF DESCRIPTION OF THE DRAWINGS

For a better understanding of the invention, reference may be had to a preferred embodiment shown in the following drawings in which:

FIG. 4 illustrates a screen shot of an exemplary registration page;

FIG. 7 illustrates a screen shot of an exemplary HTML file having consumer, platform, software, and appliance information;

DETAILED DESCRIPTION

Figure 1:
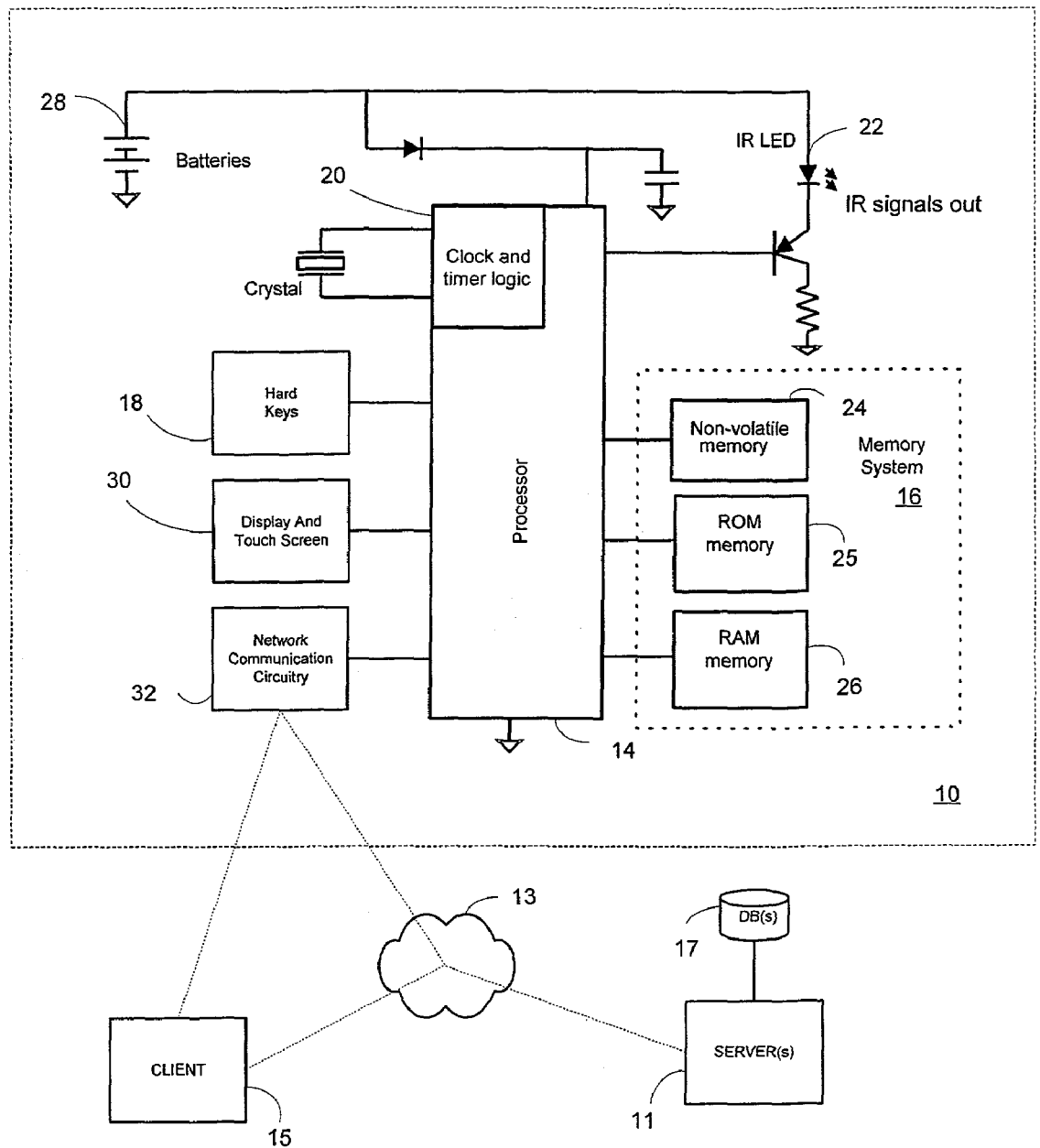
FIG. 1 illustrates a block diagram of a platform for a device having remote control functionality and an exemplary upgrade network.

Referring now to the figures, wherein like reference numerals refer to like elements, there is illustrated in FIG. 1 a device 10 having remote control functionality. As will be described in greater hereinafter, the device 10 is adapted to communicate with a server 11 via a network 13 to receive upgrade data and/or to exchange information with the server 11. Generally, the server 11 has an associated database 17 in which the information and upgrade data (received from the device 10 and downloadable to the device 10) is maintained. As will be appreciated, the device 10 may exchange communications directly with the server 11 or indirectly by means of an intermediate client 15, such as a personal computer. Furthermore, the communication exchanges can be accomplished using any suitable wired or wireless protocol.

The underlying platform of the device 10 preferably includes a processor 14 coupled to a memory system 16 comprising a combination of ROM memory 25, non-volatile read/write memory 24, and RAM memory 26; a key matrix 18 in the form of physical buttons; an internal clock and timer 20; a transmission circuit 22; a power supply 28; a touch screen display 30 to provide visible feedback to and accept input from the user of the device 10; and I/O circuitry 32 for allowing the device 10 to exchange communications with an external computer such as server 11 and/or client 15. Additional input circuitry, such as a barcode reader, may also be utilized. Representative platforms include, but are not limited to, devices such as Web tablets and/or PDAs manufactured by Compaq, HP, Palm, Visor, etc.

As will be appreciated, the memory system 16 includes executable instructions that are intended to be executed by the processor 14 to control the operation of the device 10. In this manner, the processor 14 may be programmed to control the various electronic components within the device 10, e.g., to monitor power, to cause the transmission of signals, etc. Within the memory system 16, the ROM portion of memory 25 is used to store fixed programming and data that remains unchanged for the life of the product. The non-volatile read/write memory 24, which may be FLASH, EEPROM, battery-backed up RAM, "Smart Card," memory stick, or the like, is provided to store consumer entered setup data and parameters, downloaded data, etc., as necessary. RAM memory is used by the processor for working storage as well as to hold data items which, by virtue of being backed up or duplicated on an external computer (for example, the client device 15) are not required to survive loss of battery power. While the memory system16 as illustrated comprises all three classes of memory, it will be appreciated that, in general, such a memory system need not necessarily support all three, and can be comprised of any type of computer-readable media, such as ROM, RAM, SRAM, FLASH, EEPROM, or the like in combination. Preferably, however, at least part of the memory system 16 should be non-volatile or battery backed such that basic setup parameters and operating features will survive loss of battery power. In addition, such memories may take the form of a chip, a hard disk, a magnetic disk, and/or an optical disk without limitation.

For commanding the operation of appliances of different makes, models, and types, the memory system 16 may include a command code library. The command code library is comprised of a plurality of command codes that may be transmitted from the device 10 for the purpose of controlling the operation of an appliance. The memory system 16 may also includes instructions which the processor 14 uses in connection with the transmission circuit 22 to cause the command codes to be transmitted in a format recognized by an identified appliance. While the transmission circuit 22 preferably utilizes infrared transmissions, it will be appreciated that other forms of wired or wireless transmissions, such as radio frequency, may also be used.

To identify appliances by type and make (and sometimes model) such that the device 10 is adapted to transmit recognizable command codes in the format appropriate for such identified appliances, information may be entered into the device 10. Since methods for setting up a remote control to control the operation of specific appliances are well-known, they will not be described in greater detail herein. Nevertheless, for additional details pertaining to remote control setup, the reader may turn to U.S. Pat. Nos. 6,225, 938, 4,623,887, 5,872,562, 5,614,906, 4,959,810, 4,774,511, and 4,703,359 which are incorporated herein by reference in their entirety.

To cause the device 10 to perform an action, the device 10 is adapted to be responsive to events, such as a sensed consumer interaction with one or more keys on the key matrix 18, with the touch screen display 30, or a signal from an external source such as a remote computer. More specifically, in response to an event, appropriate instructions within the memory system 16 are executed. For example, when a hard or soft command key is activated on the device 10, the device 10 may read the command code corresponding to the activated command key from the memory system 16 and transmit the command code to an appliance in a format recognizable by the appliance. It will be appreciated that the instructions within the memory system 16 can be used not only to cause the transmission of command codes to appliances but also to perform local operations. While not limiting, local operations that may be performed by the device 10 include favorite channel setup, macro button setup, command function key relocation, etc. Examples of local operations can be found in U.S. Pat. Nos. 5,481,256, 5,959,751, 6,014,092, which are incorporated herein by reference in their entirety.

As discussed, the platform illustrated in the block diagram of FIG. 1 comprises a general purpose, processor system which is controllable by software. The software may include routines, programs, objects, components, and/or data structures that perform particular tasks that can be viewed as an operating system together with one or more applications. The operating system, such as the "Windows CE" brand operating system or the like, provides an underlying set of management and control functions which are utilized by applications to offer consumer functions such as calendar, address book, spreadsheet, notepad, etc., as well as control of appliances. Additional applications can be provided for use in accessing Internet data, displaying TV guide information, and the like. Thus, it should be understood that, in terms of the internal software architecture, the "remote control" application may be but one of several possible applications which may co-exist within the device 10. It should also be understood that in terms of providing operating system functionality, the demarcation between portable device and host PC may vary considerably from product to product—at one extreme the portable unit may be nothing more than a slave display and input device in wireless communication with a fixed personal computer which performs all computational functions, at the other extreme the portable unit may be a fully-functional PC system in it's own right complete with local mass storage. It will also be appreciated that in an alternative embodiment, a similar hardware platform to that described above may be used in conjunction with a scaled-down operating system to provide remote control functionality only, as a standalone application. In all cases, however, the principles expressed herein remain the same.

To provide a means by which a consumer can interact with the device 10, the device 10 is provided with software that implements a graphical user interface. The graphical user interface software may also provide access to additional software, such as a browser application, that is used to display to the consumer items that may be received from an external computer. Such a graphical user interface system is described in pending U.S. applications Ser. Nos. 60/264, 767, 60/334,774, and 60/344,020 all of which are incorporated herein by reference in their entirety.

To support the remote control functionality of the device 10, the server 11 includes programming that generally provides an accessible Web site through which the consumer may download upgrade data, exchange information (such as downloading viewer guides, instruction manuals and uploading appliance ownership information), etc. Thus, the Web site may also function to capture information regarding the configuration of the device 10 as well as information regarding the owner of the device 10. As will become apparent from the description that follows, this information can be aggregated to generate demographic data such as, by way of example, percentage of people owning a particular make and model of an appliance in a geographic region, percentage of people owning a particular make and model of an appliance in combination with an appliance of another particular make and model, etc.

Figure 2:
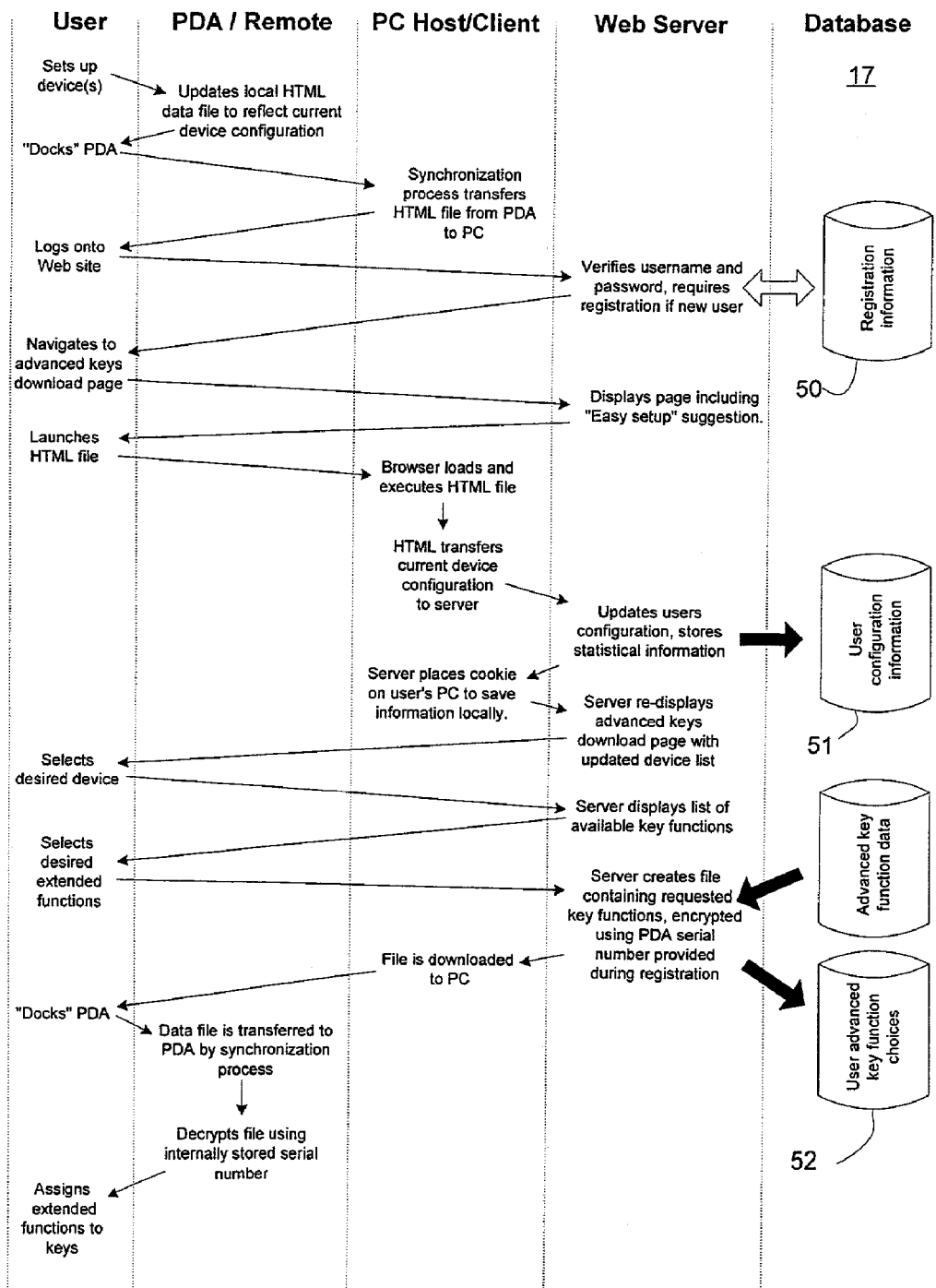
FIG. 2 illustrates exemplary steps for exchanging data with an upgrade server.

To this end, as illustrated in FIG. 2, the application providing the remote control functionality on the device 10 generates and updates a markup language file in which information utilized by the server 11 is contained. This markup language file may then be transferred from the device 10 to the client 15 as part of a normal synchronization process, such as when a PDA is docked with a PC. The markup language file can then be executed on the PC to exchange the information with the server 11. While the description that follows will assume that the communication with the server 11 is being initiated through the client 15, it is to be understood that the exchange of information described hereinafter may also be performed using direct communications between the device 10 and the server 11, such as when the remote control application is hosted on a Web tablet, Internet appliance, or the like having integrated Internet and browsing features. In this latter case, it will be appreciated by those of ordinary skill in the art that the functions shown in the second and third columns in FIG. 2 ("PDA" and "PC") will take place within a single device, the distinction between these tasks in this configuration becoming logical rather than physical.

Figure 3:
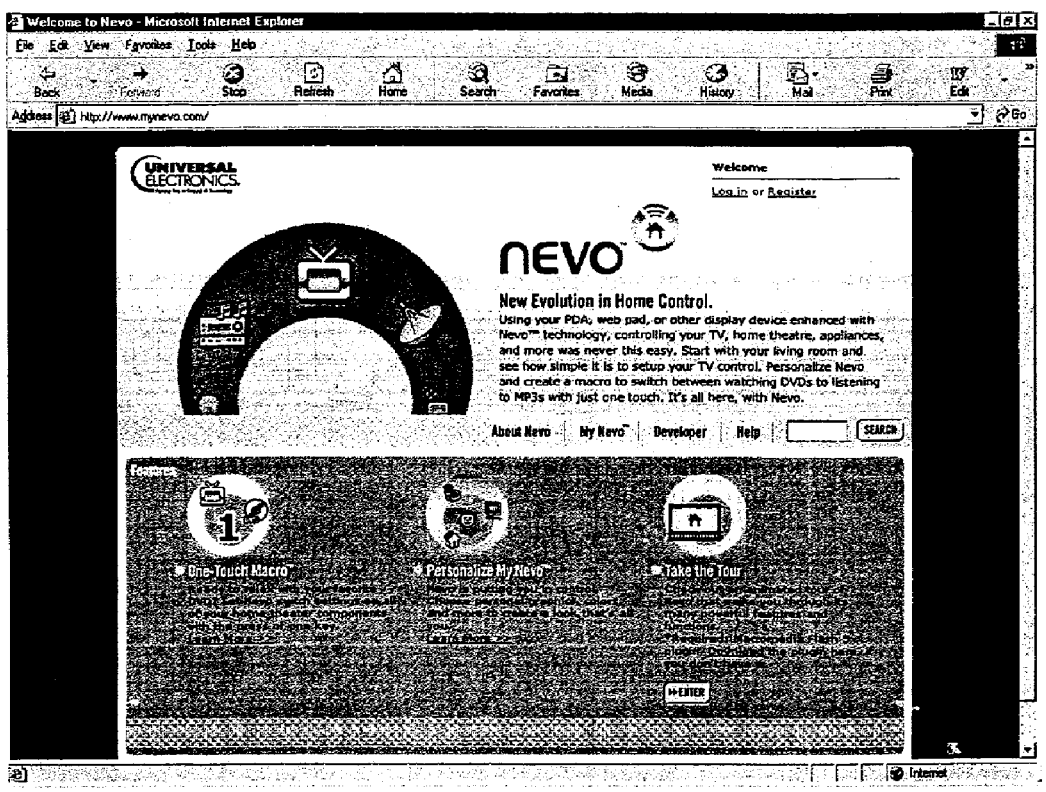
FIG. 3 illustrates a screen shot of an exemplary home page.
Figure 4:
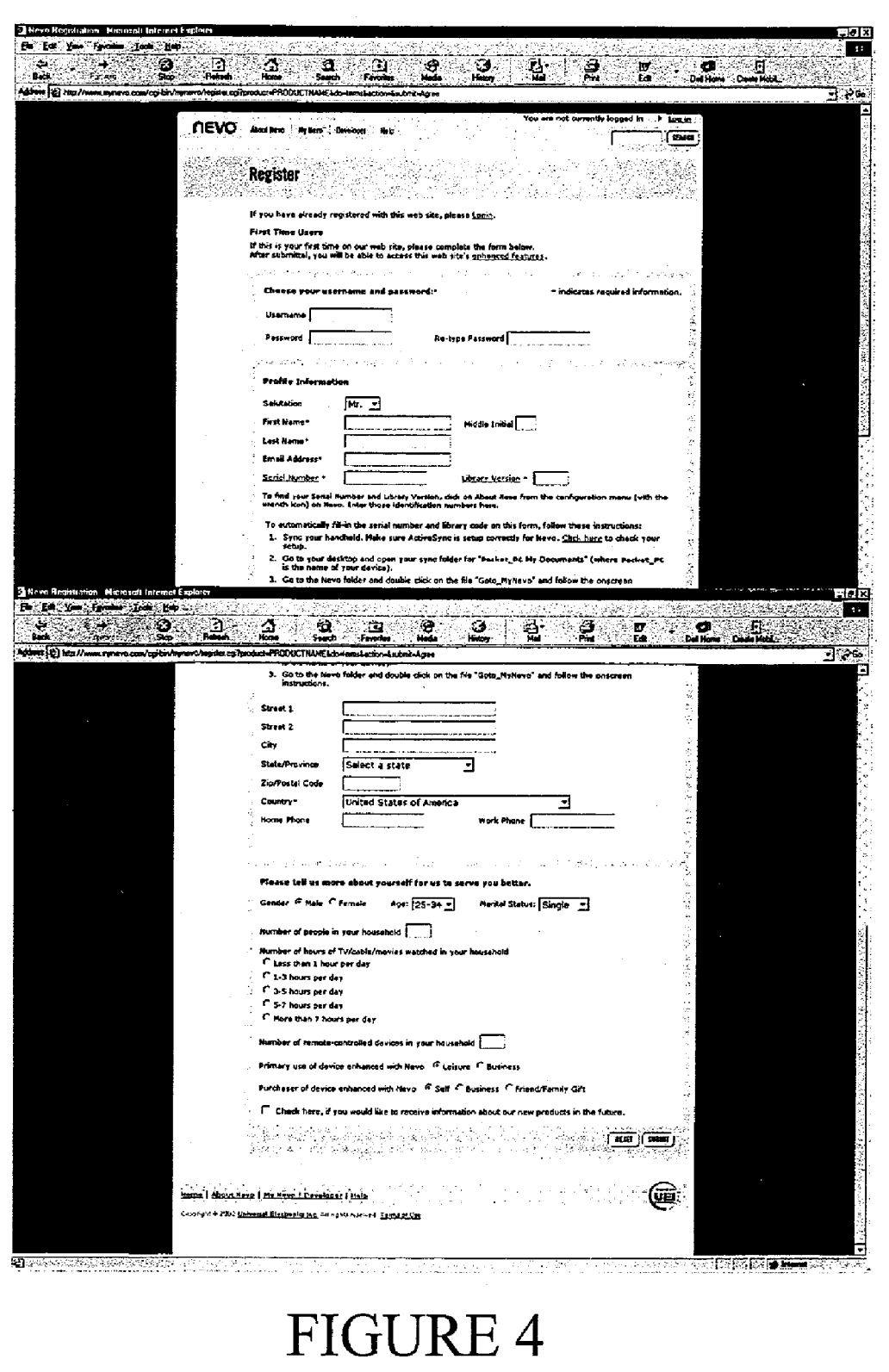

To access downloadable data/information maintained by the server 11, the consumer accesses a Web site, for example, using a conventional browser on the client 15, whereupon the consumer may be presented with a home page, an example of which is illustrated in FIG. 3. From this home page, the consumer may navigate to a download access page (e.g., by clicking on the "Personalize My . . . " link) that provides access to data that may be used to upgrade or customize the remote control functionality on the device 10. If the customer is a first time visitor to the download access page, the consumer may be requested to register with the Web site at this time. An exemplary registration page is illustrated in FIG. 4. As can be seen, information captured during the registration process may include information such as consumer name, address, sex, age, marital status, viewing habits, etc. This registration information may be maintained in the database 17 associated with the server 11. As will be understood from the description that follows, the information gathered during the Web site registration process may also be used in connection with information gathered by the device 10 (and uploaded to the server 11) to provide meaningful demographic data.

Figure 5:
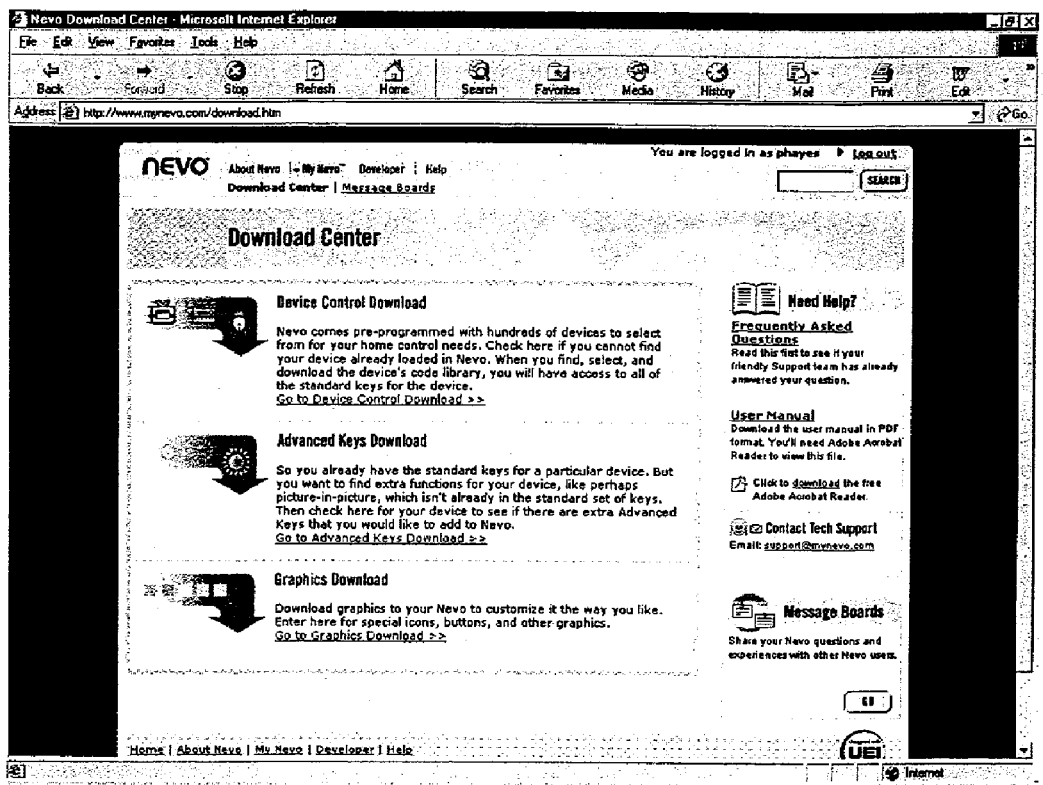
FIG. 5 illustrates a screen shot of an exemplary download access page.

Once the consumer has successfully registered with the Web site, if required, the consumer can access page(s) that provides access to the downloadable upgrade and/or customization data. An exemplary download page is illustrated in FIG. 5. Generally, the download page(s) provide access to data that can be downloaded to the device 10 to provide, for use in connection with the remote control application, a collection of command codes for generally controlling a home appliance (e.g., "device control" downloads), command codes and, possibly GUI elements, for controlling a specific operation of a home appliance (e.g., "advanced key" downloads), and/or GUI elements alone (e.g., "graphics" downloads). By way of further example, activating the link associated with the "advanced key" download results in the display of the advanced key download page illustrated in FIG. 6 by which the consumer can access downloadable data for specific home appliances owned by the consumer. An "advanced key" in this context means a command which is available on the original device's OEM remote control but which is not included in the standard set of command functions included in the library that ships with the universal remote control application. This may occur due to data storage limitations within the universal remote control, new functions or features being added by an OEM in the middle of a product life cycle, presence of little-used features which are important to only a very small subset of users, etc.

Figure 6:
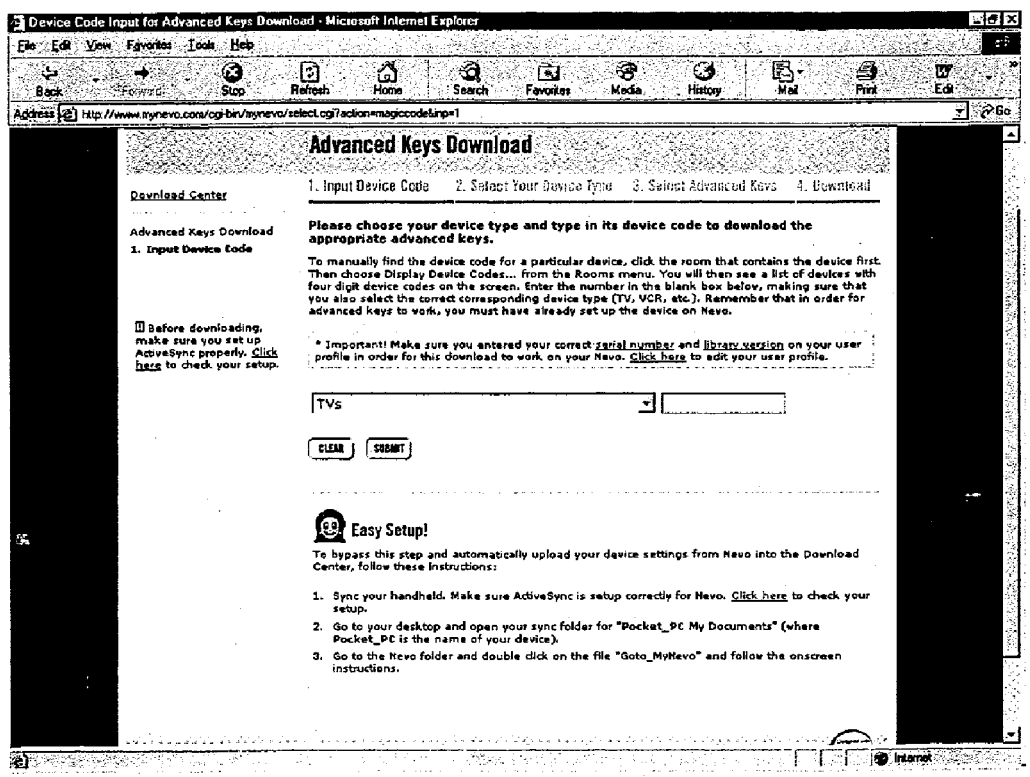
FIG. 6 illustrates a screen shot of a further exemplary download access page.

To allow the consumer to configure/update the device 10 using the Web site, the consumer may be asked to manually identify the appliance for which configure/update data is to be downloaded. For example, as illustrated in FIG. 6, the consumer can manually identify the home appliance to the Web site by supplying to the Web site (via a text entry box, pull down menu, or the like) a known setup code for an appliance, an appliance make and model number, or any other suitable information that functions as an appliance identifier. To automatically provide home appliance identity information to the Web site, as yet another means to access downloadable data or information of interest, the application that provides the remote control functionality on the device 10 may store appliance and other information in the markup language file which information is ultimately uploadable to the Web site server 11. By way of example, as illustrated by the "easy setup" instructions set forth in the download access page shown in FIG. 6, the consumer need only execute the markup language file to upload the device 10 gathered information to the Web site server 11. As noted, but not required, it is assumed in the discussion that follows that the markup language file is resident on the client 15 where the file was transferred to the client 15 during a conventional synchronization process performed with the device 10.

Turning to FIG. 7, an exemplary markup language (e.g., HTML) file containing the device 10 gathered information is illustrated. The markup language file may be created by the remote control application when the remote control application is first invoked on the device 10. Generally, the markup language file includes instructions that, when the file is executed, causes a greetings page to be displayed in a Web browser application. By way of example, the greetings page, illustrated in FIG. 8, may display to the consumer further directions and/or information for uploading information to the Web site. If the consumer is comfortable with the upload procedure, clicking on an "OK" button can result in the uploading of the device 10 gathered information to the Web site. In this regard, the uploading of the information can be accomplished using an HTTP post to a Web address that is specified in the markup language file. (see line 8 of FIG. 7).

The information uploaded to the Web site may be maintained in fields within the markup language file that are hidden, i.e., not displayed as part of the greetings page. (see lines 9–17 of FIG. 7). This information may include information regarding the consumer, for example, the first and last name of the consumer. As will be appreciated by those of skill in the art, the consumer information would typically be provided as part of an initialization or registration process when the device 10 is first activated, especially when the device 10 is a PDA or the like hosting a Windows brand operating system. The consumer information entered as part of the operating system initialization process would be stored in a file that is readable by applications running on the device 10, including the one which provides the remote control functionality. Alternatively, the application providing the remote control functionality could itself request that the consumer provide this information. This customer specific information is particularly useful as a cross-reference to information obtained during the Web registration process, as is the device serial number as described in more detail later.

Further included in the markup language file is information that identifies the remote control application and the hardware platform, including versioning. This information can be used by the Web site to ensure that compatible data is supplied back to the device 10. As will be understood by those of skill in the art, this information can be obtained by reading a registry file, by being set as a default value in the markup language file template, or the like. In cases where a unique serial number is assigned to the device 10 at time of manufacture, stored in a non-alterable fixed form, and made accessible to application programs, this is the most convenient and preferred cross-reference value to the information provided by the Web registration process. (see line 10 of FIG. 7). Where such embedded serial numbers are not available, a serial number associated with the remote control application software itself, one assigned to the user at Web site registration time, etc., may be used as a substitute.

Still further, the markup language file includes data that functions to identify the one or more appliances the device 10 has been setup to control. This information is particularly found in line 13 of the exemplary markup language file illustrated in FIG. 7 and is dynamically maintained as part of the remote control application setup process (i.e., every time the remote control setup process is used to add or delete a device this file entry may be updated to reflect the new values.) In those devices implemented using a "Windows CE" brand operating system or the like which support automatic synchronization, simply making a change to the file in this manner is sufficient to cause an automatic update or synchronization of the PC-side copy of this file the next time the device is docked or otherwise communicates with it's host.

To effectively identify the appliance to the server 11, the appliance information preferably includes both a device type and number field (shown as four hexadecimal numbers where the first number is indicative of the appliance type (e.g., TV, VCR, etc.) and the last three numbers are indicative of the specific library of command codes to which the appliance responds (e.g., corresponding to three-digit setup code used during the remote control setup process)). In the case where the particular brand name of the appliance is specified to the device 10 during the remote control setup process (e.g., when a setup by brand method is utilized), the brand name is also included in the information. Otherwise, the brand name may be set to a null value (i.e., indicated by the entry "( )") when it is not possible to discern the brand name from other setup information (e.g., the setup code "0033" for a "Panasonic" brand TV may also be the setup code for the same TV that is sold under secondary brand names such as "Quasar" or "Technics" or private labels such as "Sears" or "Radio Shack").

Figure 8:
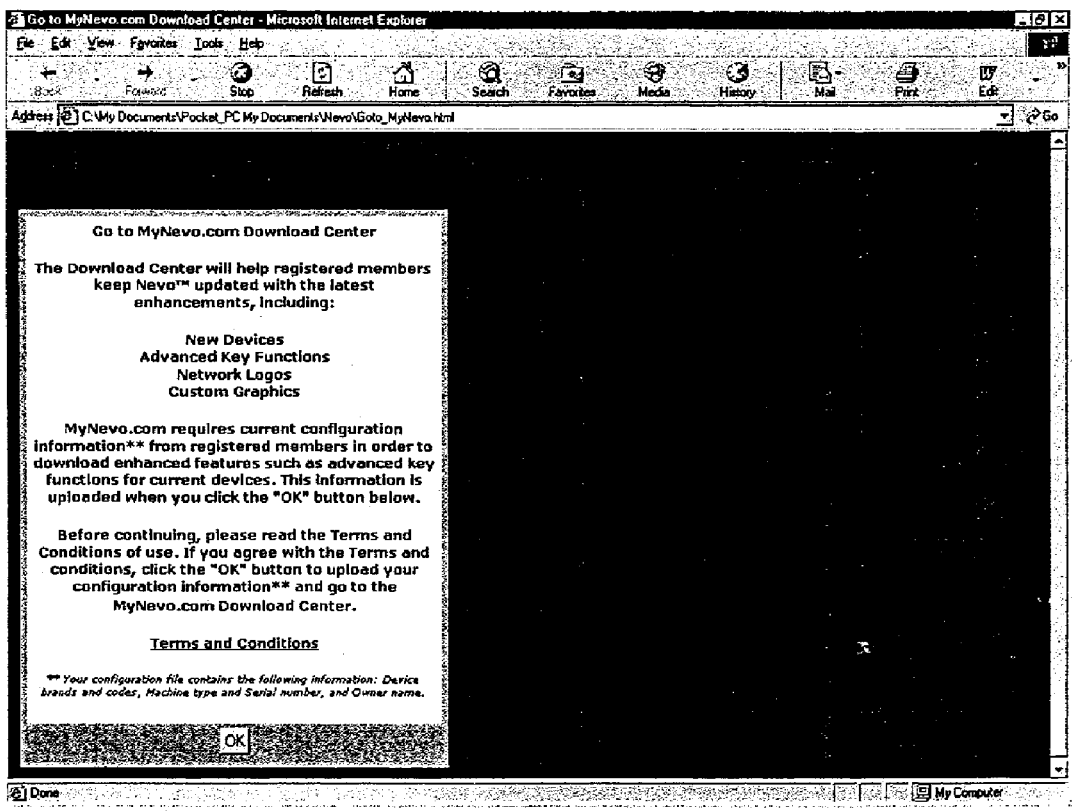
FIG. 8 illustrates a screen shot of an exemplary greetings page generated using the HTML file of FIG. 7.
Figure 9:
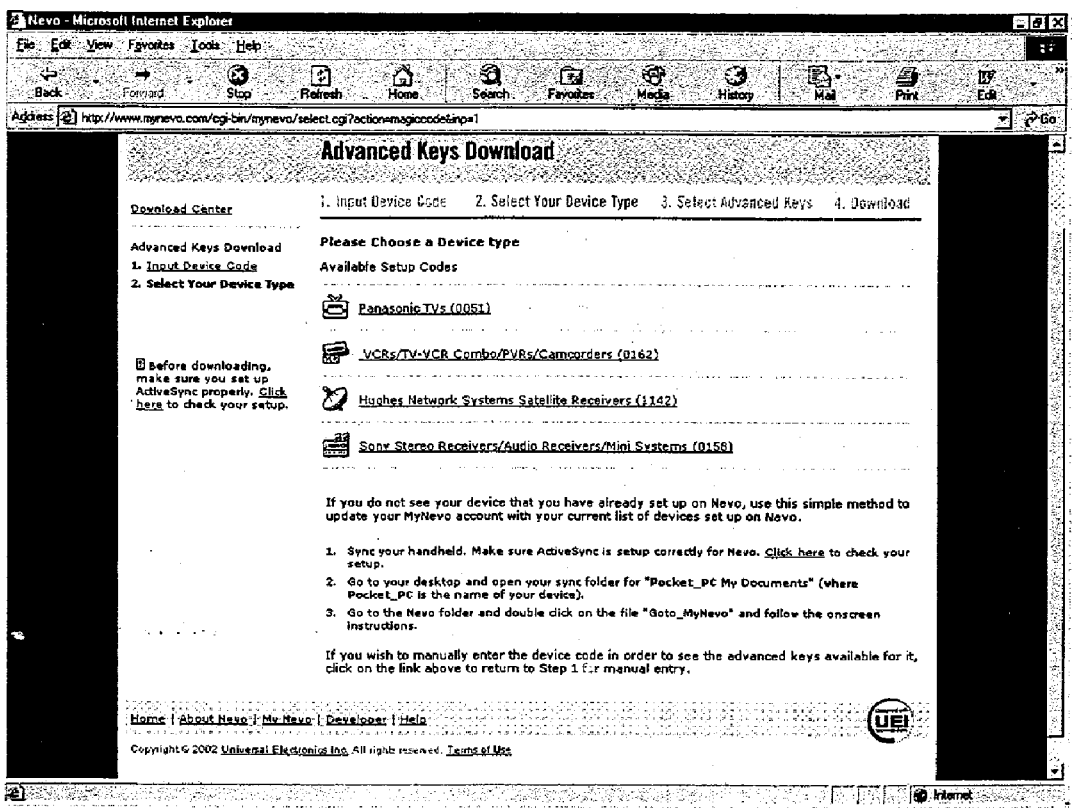
FIG. 9 illustrates a screen shot of yet another exemplary download access page.

In the case where the consumer has clicked on the "OK" button in the page illustrated in FIG. 8, the information in the markup language file is uploaded to the specified Web site address and the information is used to automatically display to the consumer downloads available for the appliances setup to be controlled using the remote control application. An example download page is illustrated in FIG. 9 wherein links are provided to access downloadable data that is specifically available for the equipment the remote control application was setup to command, namely, a "Panasonic" brand TV, a "Hughes" brand satellite receiver, a "Sony" brand stereo receiver, and an unbranded, but specific VCR-like device that has command codes maintained in a library identified by the setup code "0162" ("0a2" in hexadecimal). The download page may also provide instructions to the consumer to cure any oversights that resulted in an expected appliance not being listed or an appliance being listed in error.

Figure 10:
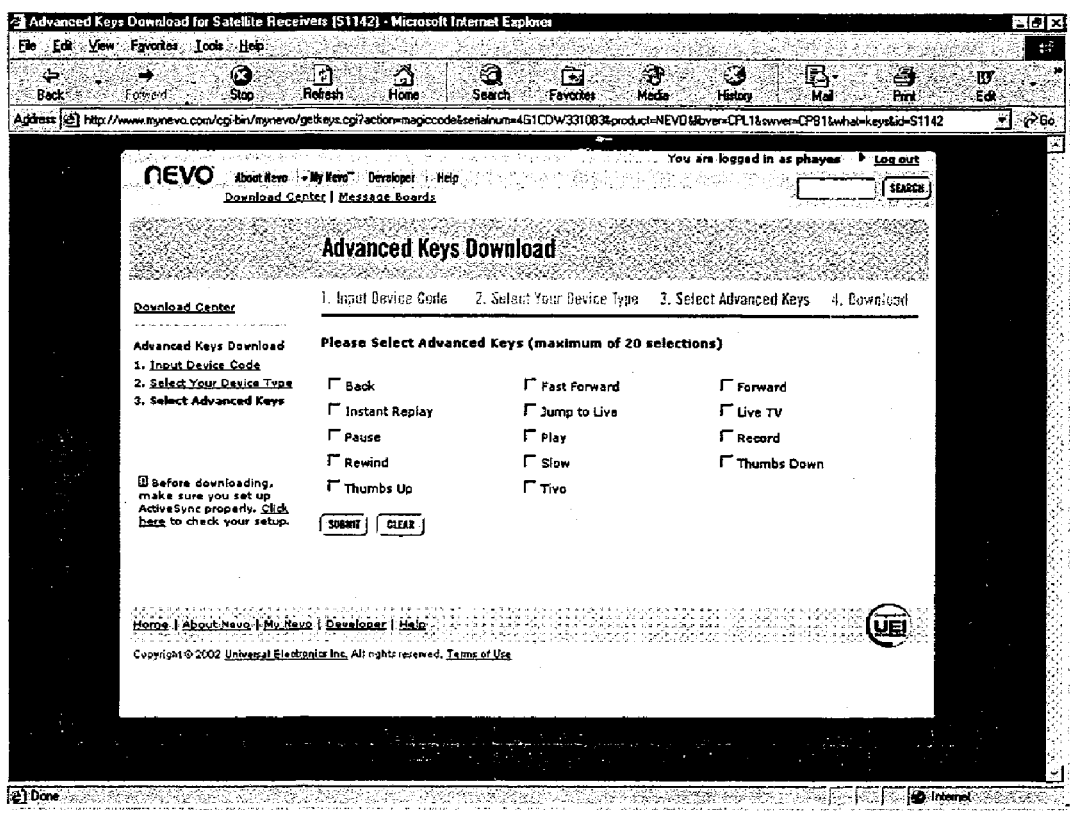
FIG. 10 illustrates a screen shot of still another exemplary download access page.

At this time, the consumer may elect to download configuration/download data for a specific appliance by selecting a link to a further download page specific to that appliance. For example, if the consumer clicked on the link corresponding to the "Hughes" brand satellite receiver as illustrated in FIG. 9, downloads for the "Hughes" satellite receiver, such as advanced key features available, can be automatically presented to the consumer as illustrated in FIG. 10. The consumer may then choose the downloads of interest (e.g., by clicking on a corresponding check box) and request the initiation of the download process (e.g., by clicking on the "Submit" button). In response, a data file containing the selected data (i.e., command code data and/or GUI elements) is automatically downloaded to the client 15 or device 10, as appropriate. In the case where the data is downloaded to the client 15, the downloaded data may be transferred to the device 10 the next time the device 10 is synchronized with the client 15. The new data would then be available to the consumer to setup the remote control application to use the downloaded command code(s) and/or GUI element(s) when the remote control application is set in a mode to control the appliance for which the data was downloaded.

To provide a measure of security, it is contemplated that the downloaded data can be encrypted. For example, the data file can be encrypted using the serial number provided during the Web site registration process. The remote control application would likewise use the serial number to decrypt the data file. Since in the illustrative embodiment the remote control application reads the serial number from internal memory, which serial number is unalterable, it may be ensured that the data file is only useful for the device for which it was intended.

The information uploaded to the server 11 may also be maintained within the database 17 for use in providing meaningful demographic data. In some instances, this uploaded information may be cross-referenced with other information stored on the database 17, such as that gathered during the Web site registration process. In this regard, meaningful information is received at three points during the process described. Referring once again to FIG. 2, these occur at the time of initial registration 50 (see also FIG. 4), when execution of the HTML file (see also FIGS. 7, 8) transfers the consumer's current equipment configuration to the Web server 51, and when the consumer selects 52 the additional key functions he wishes to download into his remote control application (see also FIG. 10.) Not illustrated in detail but additionally available to the consumer in an exemplary embodiment is the ability to download an entire standard IR code set for a device (as opposed to simply acquiring additional key functions for a device which already exists), for example where a new device is released to the market after the consumer's acquisition of the remote control application. (This is the first choice listed in the display shown in FIG. 5.)

By way of example, the information collected at step 51, when combined with the registration information 50 can be used to generate demographic data such as appliance ownership by brand, by geographical region, by gender, by age, by marital status, by viewing habits, by remote control device brand or model (deduced from version and serial number), etc., or any combination of the above parameters—for example, "What percentage of upgradeable remote control users living within zip codes 90000 to 99999 who own a Sony branded satellite receiver are single males under the age of 25?" This information can also be used to cross-reference ownership of different equipment types, since the consumer's entire configuration is captured whenever he logs on. By way of further example, questions such as "How many satellite subscribers also own a PVR?" or "What percentage of brand 'x' televisions also own brand 'x' VCRs?" or "What proportion of setup code 0033 televisions are branded 'Panasonic' and what proportion are branded 'Quasar'?" may be easily answered, with or without further sub-categorization as described above. In this regard, it will be appreciated that since this information is captured "live" and is representative of each consumer's current equipment configuration, such reports will reflect "installed base" on an ongoing basis over the life of a product and may thus provide greater insight than simple raw initial sales or shipment figures.

The information on specific key data requested at step 52 can provide valuable insight into which key functions are perceived as important by the users of specific device types or models. This information can be used by manufacturers of universal remote control products to "fine tune" the standard function libraries that are pre-loaded into their product at time of shipment. For example, with reference to FIG. 10, if it is found that a disproportionately large percentage of Hughes Network Systems Satellite Receiver (setup code 1142) owners are requesting the key function "Instant Replay," this function may be considered for inclusion in the next release of the standard code library for that device. Similarly, the number of accesses to download a newly-released product may be monitored in order to determine an appropriate time to add it to standard pre-loaded library offerings.

While specific embodiments of the invention have been described in detail, it will be appreciated by those skilled in the art that various modifications and alternatives to those details could be developed in light of the overall teachings of the disclosure. Accordingly, the particular arrangement disclosed is meant to be illustrative only and not limiting as to the scope of the invention which is to be given the full breadth of the appended claims and any equivalents thereof.

What is claimed is:

1. A method for upgrading a remote control application resident on a device, comprising:
   storing in a markup language file a representation of information used to setup the remote control application to communicate with an appliance;
   storing information representative of the remote control application in the markup language file;
   executing the markup language file to upload the representation of the information and the information representative of the remote control application to a remote server; and
   using the uploaded representation of the information and the information representative of the remote control application to automatically display user-selectable, downloadable data files relevant to the appliance and compatible with the remote control application which data files may be used to upgrade the remote control application resident on the device.

2. The method as recited in claim 1, further comprising storing the markup language file in memory on the device, synchronizing the markup language file with a personal computer, and executing the markup language file on the personal computer.

3. The method as recited in claim 1, wherein the downloadable data files contain command codes for use in transmitting control commands from the device to the appliance.

4. The method as recited in claim 1, wherein the downloadable data files contain graphical user interface elements for use in displaying command keys on the device, the command keys being activatable to cause the transmission of control commands to the appliance.

5. The method as recited in claim 1, further comprising storing at the remote server the representation of the information used to setup the remote control application and using the stored information to generate demographic data.

6. The method as recited in claim 5, further comprising requiring a user to register with the remote server before allowing access to the downloadable data, storing at the remote server information provided as part of registration, using the registration information in combination with the information uploaded from the remote control application to generate the demographic data.

7. The method as recited in claim 1, wherein the device is a PDA.

8. The method as recited in claim 1, wherein the device is a Web tablet.

9. A method of generating data pertaining to consumer appliance preferences, comprising:
   receiving at a Web site a first set of information captured by a remote control application, the first set of information being indicative of appliances the remote control application is setup to command the operation of;
   capturing at the Web site a second set of information supplied by a user, the second set of information being indicative of characteristics of the user and supplied by the user during a registration process with the Web site; and
   cross-referencing the first set of information to the second set of information to generate demographic data related to consumer appliance preferences.

10. The method as recited as in claim 9, further comprising capturing at the Web site a third set of information supplied by a user, the third set of information being indicative of consumer upgrade preferences and generated as a result of a user requesting upgrade downloads from the Web site for use in connection with the remote control application, and further cross-referencing the third set of information to the first set of information or the second set of information to generate demographic data related to consumer appliance preferences.

11. The method as recited in claim 9, wherein the first set of information comprises appliance setup codes entered for use in setting up the remote control application to command the operation of appliances.

12. The method as recited in claim 9, wherein the second set of information comprises a user name and geographic location.

13. A method for upgrading a remote control application resident on a device, comprising:
   storing in a markup language file a representation of information used to setup the remote control application to communicate with an appliance;
   storing information representative of a hardware platform for the device in the markup language file;
   executing the markup language file to upload the representation of the information and the information representative of the hardware platform for the device to a remote server; and
   using the uploaded representation of the information and the information representative of the hardware platform for the device to automatically display user-selectable, downloadable data files relevant to the appliance and compatible with the hardware platform for the device which data files may be used to upgrade the remote control application resident on the device.

14. The method as recited in claim 13, further comprising storing the markup language file in memory on the device, synchronizing the markup language file with a personal computer, and executing the markup language file on the personal computer.

15. The method as recited in claim 13, wherein the downloadable data files contain command codes for use in transmitting control commands from the device to the appliance.

16. The method as recited in claim 13, wherein the downloadable data files contain graphical user interface elements for use in displaying command keys on the device, the command keys being activatable to cause the transmission of control commands to the appliance.

17. The method as recited in claim 13, further comprising storing at the remote server the representation of the information used to setup the remote control application and using the stored information to generate demographic data.

18. The method as recited in claim 17, further comprising requiring a user to register with the remote server before allowing access to the downloadable data, storing at the remote server information provided as part of registration, using the registration information in combination with the information uploaded from the remote control application to generate the demographic data.

19. The method as recited in claim 13, wherein the device is a PDA.

20. The method as recited in claim 13, wherein the device is a Web tablet.

* * * * *